(12) United States Patent
Perkins

(10) Patent No.: US 8,944,892 B2
(45) Date of Patent: Feb. 3, 2015

(54) METHOD OF DRESSING AN ABRASIVE WHEEL USING A POLYCRYSTALLINE CVD SYNTHETIC DIAMOND DRESSER AND METHOD OF FABRICATING THE SAME

(71) Applicant: Element Six Technologies Limited, London (GB)

(72) Inventor: Neil Perkins, Oxfordshire (GB)

(73) Assignee: Element Six Technologies Limited, London (GB)

( * ) Notice: Subject to any disclaimer, the term of this patent is extended or adjusted under 35 U.S.C. 154(b) by 0 days.

(21) Appl. No.: 14/362,830

(22) PCT Filed: Dec. 12, 2012

(86) PCT No.: PCT/EP2012/075249
§ 371 (c)(1),
(2) Date: Jun. 4, 2014

(87) PCT Pub. No.: WO2013/087703
PCT Pub. Date: Jun. 20, 2013

(65) Prior Publication Data
US 2014/0335766 A1  Nov. 13, 2014

Related U.S. Application Data

(60) Provisional application No. 61/576,574, filed on Dec. 16, 2011.

(30) Foreign Application Priority Data

Dec. 16, 2011 (GB) .................................. 1121637.1

(51) Int. Cl.
*B24B 1/00* (2006.01)
*B24B 53/047* (2006.01)
(Continued)

(52) U.S. Cl.
CPC .............. *B24B 53/047* (2013.01); *B24B 53/12* (2013.01); *B24D 18/00* (2013.01)
USPC .......... 451/56; 125/11.01; 125/11.02; 51/293

(58) Field of Classification Search
CPC ....................................................... B24B 53/12
USPC .............. 451/56, 443, 444; 125/11.01, 11.02; 51/293
See application file for complete search history.

(56) References Cited

U.S. PATENT DOCUMENTS 2,889,822 A   6/1959  Metzger et al.
3,508,533 A * 4/1970  Abrams .................... 125/11.01
(Continued)

FOREIGN PATENT DOCUMENTS

DE  10 2010 000921 A1   7/2010
GB       777257 A        6/1957
(Continued)

OTHER PUBLICATIONS

Search Report for GB1222321.0 dated Apr. 10, 2013.
(Continued)

*Primary Examiner* — Maurina Rachuba
(74) *Attorney, Agent, or Firm* — Bryan Cave LLP

(57) ABSTRACT

A method of dressing a wheel using a polycrystalline CVD synthetic diamond dresser, the method comprising: rotating the wheel; and contacting a working surface of the wheel with a working surface of the polycrystalline CVD synthetic diamond dresser, wherein the polycrystalline CVD synthetic diamond dresser is oriented such that a leading edge of the working surface of the polycrystalline CVD synthetic diamond dresser is formed of larger grains than a trailing edge of the working surface of the polycrystalline CVD synthetic diamond dresser.

12 Claims, 6 Drawing Sheets

(51) Int. Cl.
*B24B 53/12* (2006.01)
*B24D 18/00* (2006.01)

(56) References Cited

U.S. PATENT DOCUMENTS

| | | | | |
|---|---|---|---|---|
| 4,300,522 A | * | 11/1981 | Henry et al. | 125/11.01 |
| 4,419,979 A | * | 12/1983 | Hughes | 125/11.01 |
| 4,450,826 A | * | 5/1984 | Remy | 125/11.02 |
| 6,659,161 B1 | | 12/2003 | Sung | |
| 8,192,256 B2 | * | 6/2012 | Andrews et al. | 125/11.02 |

FOREIGN PATENT DOCUMENTS

| | | |
|---|---|---|
| GB | 2165781 A | 4/1986 |
| JP | 06039716 A | 2/1994 |

OTHER PUBLICATIONS

Search Report for GB1121637.1 dated Apr. 11, 2012.
International Search Report for PCT/EP2012/075249 dated Apr. 8, 2013.

* cited by examiner

METHOD OF DRESSING AN ABRASIVE WHEEL USING A POLYCRYSTALLINE CVD SYNTHETIC DIAMOND DRESSER AND METHOD OF FABRICATING THE SAME

FIELD OF INVENTION

Certain embodiments of the invention relate to polycrystalline CVD diamond wheel dresser parts and methods of utilizing the same.

BACKGROUND OF INVENTION

Grinding, polishing, and cutting wheels are used in a variety of industrial processes. Such wheels generally comprise a matrix of abrasive particles forming a working surface around an outer peripheral surface of the wheel. In use, such wheels are rotated and placed in contact with a part which is to be ground, polished or cut. During use such wheels can be deformed from their original wheel profile, become glazed due to rounding of the abrasive grains at the working surface of the wheel, or become loaded with contaminant material. Dressing a wheel is intended to remove portions of the working surface of the wheel in order to return the wheel to its original profile, dislodge rounded abrasive grains to expose fresh grains, and/or clean contaminant material from the wheel. This is achieved by rotating the wheel and moving a wheel dresser tool across the working surface of the wheel.

FIG. 1 illustrates the process of wheel dressing. A wheel 2 having a working surface 4 is rotated in a direction R. A dresser tool 6 comprising a dresser work piece 8 in a holder 10 is applied to the working surface of the wheel and moved backwards and forwards across the working surface of the wheel in a direction X which is perpendicular to the direction of rotation or the working surface of the wheel at the point of contact and parallel to the axis of rotation of the wheel. Material is removed from the working surface of the wheel to regain a good working surface such that the working lifetime of the wheel can be extended.

Diamond material has been found to be useful for the fabrication of dresser tools due to its extreme hardness and wear resistance. Such diamond dresser tools generally comprise a diamond work piece mounted in a holder which may be fabricated, for example, using a metal material. The diamond work piece may be fabricating using a single crystal of natural, CVD synthetic, or HPHT synthetic diamond material. Alternatively, the diamond work piece may comprise a plurality of diamond grains bounded in a matrix of binder material. Alternatively still, the diamond work piece may be fabricating using polycrystalline CVD synthetic diamond material which comprises a plurality of diamond grains directly bonded together via diamond-to-diamond bonding as a result of the CVD growth method.

The present invention relates specifically to diamond dresser tools in which the diamond work piece of the tool is formed of a polycrystalline CVD diamond work piece. Such polycrystalline CVD synthetic diamond dressers are fabricated as illustrated in FIG. 2. First, a free-standing disk of polycrystalline CVD diamond material 20 is fabricated using for example, a microwave plasma activated CVD diamond synthesis technique. A plurality of dresser logs 22 can then be laser cut from the disk of polycrystalline CVD diamond material 20 (only one dresser log 22 is illustrated for clarity). The dresser logs 22 have a working surface 24. The dresser logs are mounted in a holder 26 with the working surface 24 exposed for dressing applications. During use the working surface 24 is applied to a working surface of a wheel as illustrated in FIG. 1. Over time the working surface 24 is worn away and the dresser log gradually gets shorter along a length l as illustrated in FIG. 2 until it is completely worn back and a new tool is needed.

It is an aim of embodiments of the present invention to decrease the wear rate of polycrystalline CVD synthetic diamond dresser parts thereby increasing their lifetime in use.

SUMMARY OF INVENTION

According to a first aspect of the present invention there is provided a method of dressing a wheel using a polycrystalline CVD synthetic diamond dresser, the method comprising:
    rotating the wheel; and
    contacting a working surface of the wheel with a working surface of the polycrystalline CVD synthetic diamond dresser,
    wherein the polycrystalline CVD synthetic diamond dresser is oriented such that a leading edge of the working surface of the polycrystalline CVD synthetic diamond dresser is formed of larger grains than a trailing edge of the working surface of the polycrystalline CVD synthetic diamond dresser.

According to a second aspect of the present invention there is provided a method of fabricating a polycrystalline CVD synthetic diamond dresser, the method comprising:
    fabricating a free-standing wafer of polycrystalline CVD synthetic diamond material having a nucleation face and a growth face, the growth face comprising larger grains than the nucleation face;
    cutting the free-standing wafer of polycrystalline CVD synthetic diamond material to form a polycrystalline CVD synthetic diamond dresser;
    and marking the polycrystalline CVD synthetic diamond dresser to indicate which side of the polycrystalline CVD synthetic diamond dresser corresponds to the growth face comprising larger grains whereby in use the polycrystalline CVD synthetic diamond dresser can be consistently oriented such that a leading edge of a working surface of the polycrystalline CVD synthetic diamond dresser is formed of larger grains than a trailing edge of the working surface of the polycrystalline CVD synthetic diamond dresser.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 2:
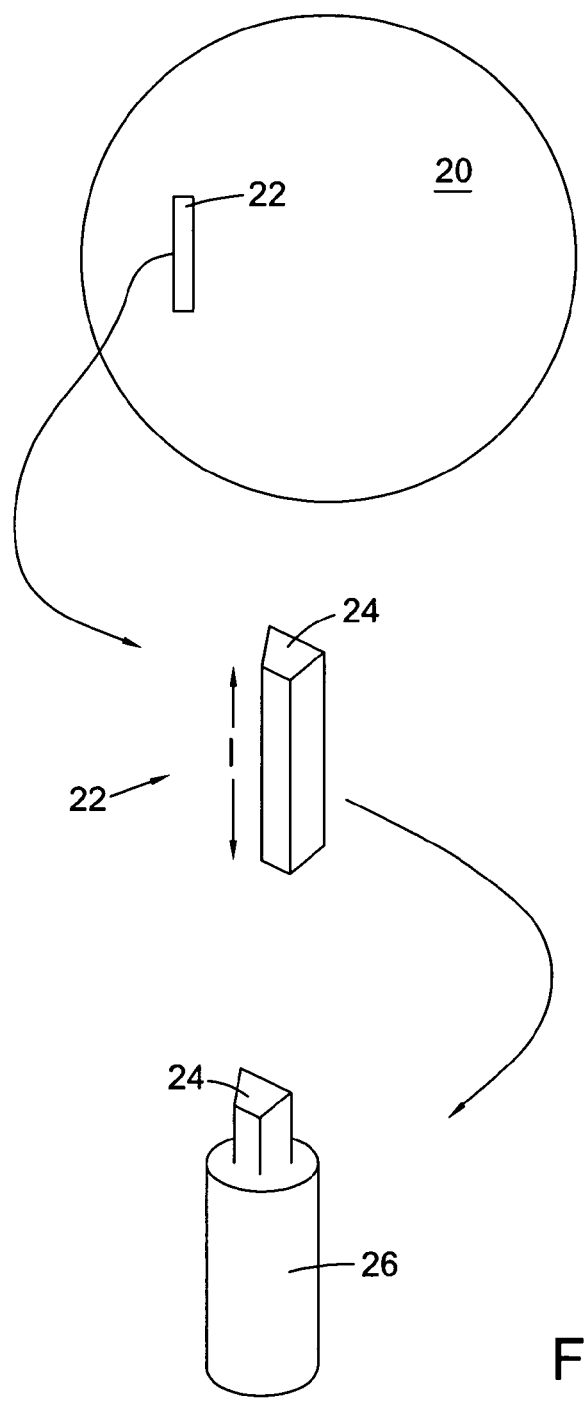
FIG. 2 illustrates the steps involved in fabricating a polycrystalline CVD synthetic diamond dresser.

Polycrystalline CVD synthetic diamond material is inherently anisotropic. This is because as a disk of polycrystalline CVD synthetic diamond material is grown the grain size of the material gradually increases. As such, a nucleation face of a polycrystalline CVD synthetic diamond disk comprises small grains than a growth face. When a dresser part is laser cut from a disk of polycrystalline CVD synthetic diamond material as illustrated in FIG. 2 this anisotropy in grain size through the thickness of the disk is transferred to a corresponding anisotropy in grain size across the working end surface of the dresser part.

The present inventors have postulated that this inherent anisotropy in structure should lead to a corresponding anisotropy in wear rate. However, while orientation performance has been observed for single crystal diamond dresser parts relating different wear rates for specific crystallographic planes and directions, previously data for polycrystalline CVD synthetic diamond dresser parts has suggested that wear rate of polycrystalline CVD synthetic diamond material in dresser part applications is independent of the orientation of the polycrystalline CVD synthetic diamond dresser part in use.

Figure 3:
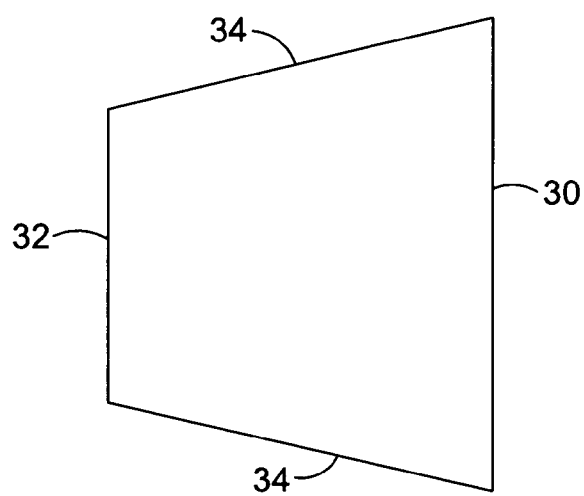
FIG. 3 illustrates a working surface of a polycrystalline CVD synthetic diamond dresser.

FIG. 3 shows a plan view of a working surface of a dresser part. The working surface comprises: a first edge 30 comprising larger grains corresponding to a growth surface side of the disk from which the dresser part was cut; a second edge 32 opposite to the first edge 30, the second edge 32 comprising smaller grains and corresponds to a nucleation surface side of the disk from which the dresser part was cut and side edge 34 extending from the first edge to the second edge and comprising grains which gradually decrease in size from the first edge to the second edge.

Figure 1:
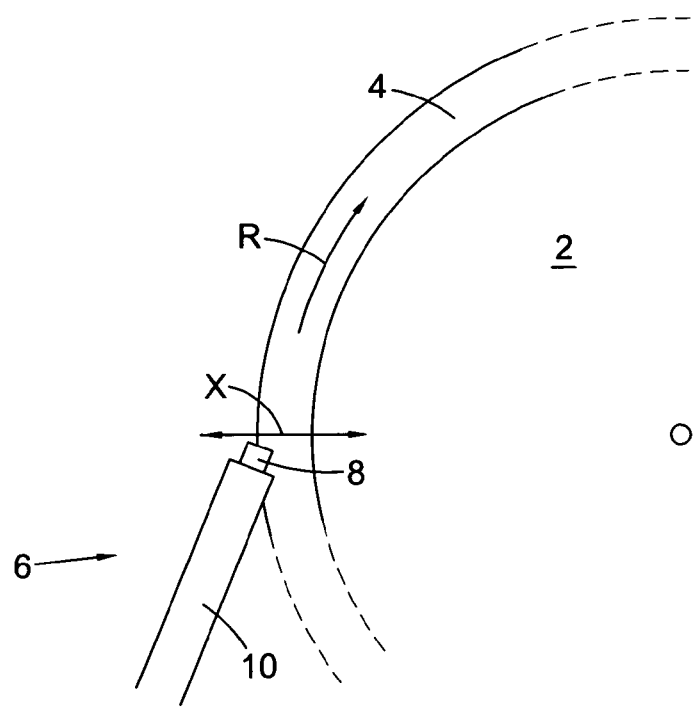
FIG. 1 illustrates the process of wheel dressing.
Figure 4A:
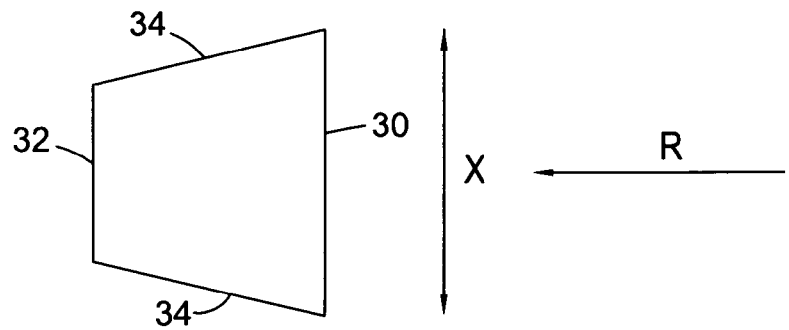
FIGS. 4(a) to 4(c) illustrate various possible orientation of the working surface of a polycrystalline CVD synthetic diamond dresser relative to the motion of a wheel being dressed.
Figure 4B:
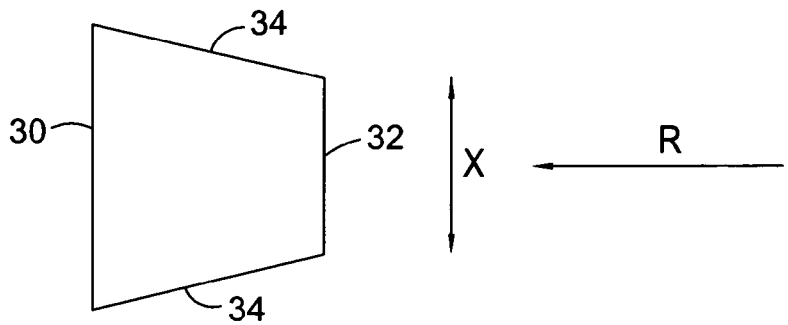
Figure 4C:
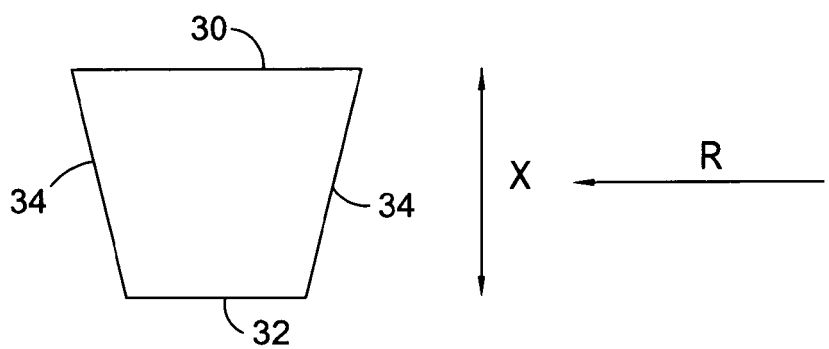

When placed on a wheel during a dressing application the working surface of the dresser part may be oriented such that any one of the aforementioned edges forms a lead edge over which a portion of the rotating wheel passes. As side edges 34 correspond to identical structural orientations, this results in three possible working orientation as illustrated in FIGS. 4(*a*) to 4(*c*) (in the Figures the direction of wheel rotation is indicated by reference R and the side-to-side motion of the dresser part is indicated by reference X in a similar manner to that illustrated in FIG. 1):

(i) The working surface of the dresser part may be applied to a rotating wheel such that the first edge 30 forms the leading edge. In this case, a portion of the rotating wheel will first pass over the edge 30 comprising larger grains and then propagate across the working surface of the dresser before losing contact with the working surface at a trailing edge formed by the second edge 32 comprising smaller grains. This arrangement is illustrated in FIG. 4(*a*).

(ii) The working surface of the dresser part may be applied to a rotating wheel such that the second edge 32 forms the leading edge. In this case, a portion of the rotating wheel will first pass over the second edge 32 comprising smaller grains and then propagate across the working surface of the dresser before losing contact with the working surface at a trailing edge formed by the second edge 30 comprising larger grains. This arrangement is illustrated in FIG. 4(*b*).

(iii) The working surface of the dresser part may be applied to a rotating wheel such that a side edge 34 forms the leading edge. In this case, a portion of the rotating wheel will first pass over a side edge 34 comprising larger and smaller smaller grains and then propagate across the working surface of the dresser before losing contact with the working surface at a trailing edge formed by the opposite side edge 34 which also comprises larger and smaller grains. This arrangement is illustrated in FIG. 4(*c*).

Surprisingly it has been found that the orientation illustrated in FIG. 4(*a*) results in decreased wear rate and increased dresser part lifetime when compared to the orientations illustrated in FIGS. 4(*b*) and 4(*c*). That is, it is advantageous to mount the dresser part such that in a dressing application the leading edge of the working surface of the dresser part comprises larger grains corresponding to the growth surface of the polycrystalline CVD synthetic diamond disk from which the dresser part was cut. In testing it has been found that the faster wear rate and the lowest lifetime orientation is that in which the leading edge comprises the smallest grains corresponding to the growth surface of the polycrystalline CVD synthetic diamond disk from which the dresser part was cut (FIG. 4(*b*)). Re-orienting the dresser part such that a leading edge is formed from a side edge of the working surface results in a reduction in wear rate and a 30% increase in lifetime of the dresser part (FIG. 4(*c*)). However, re-orienting the dresser part to the orientation shown in FIG. 4(*a*) results in a further reduction in wear rate and a 70% increase in lifetime of the dresser part. As such, the orientation illustrated in FIG. 4(*a*) is significantly better than other possible orientation.

Figure 5:
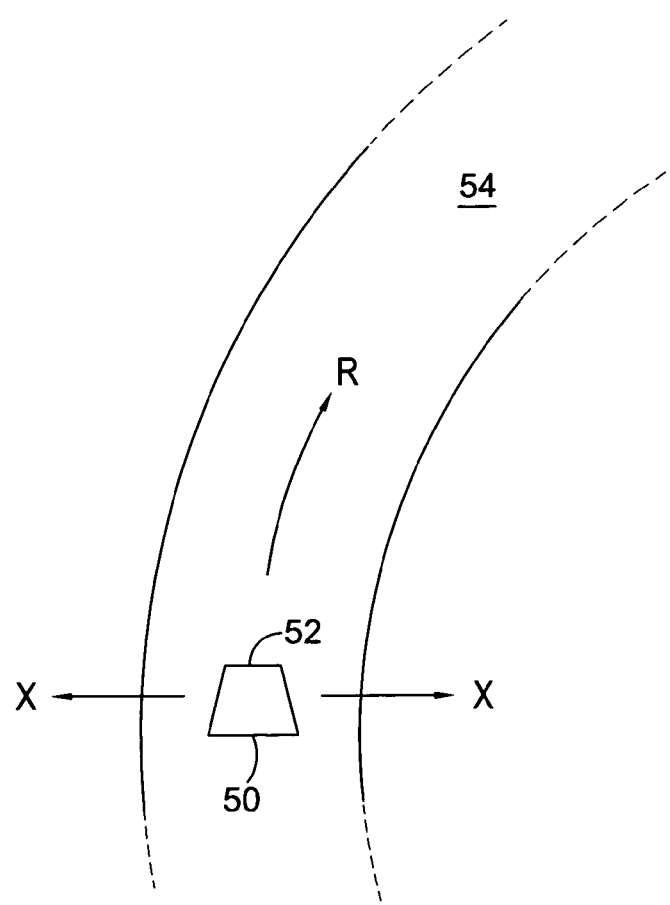
FIG. 5 illustrates the preferred orientation of a dresser part in use.

In light of the above, it is clearly advantageous to orient a polycrystalline CVD synthetic dresser part in the configuration illustrated in FIG. 5. Here, the dresser part is correctly oriented such that the lead edge 50 of the working surface corresponds to the growth face of the disk from which the dresser part was cut and comprises larger grains compared to the trailing edge 52 which corresponds to the nucleation face of the disk from which the dresser part was cut. In the Figure, the wheel 54 is rotated in a direction R and the dresser part is moved backwards and forwards across the wheel in a direction X.

In order to correctly orient the dresser part as indicated above, it is advantageous to provide the dresser part with a suitable mark such that the lead edge can be readily identified by eye. That is, the polycrystalline CVD synthetic diamond dresser is provided with a visual marker to indicate correct orientation whereby in use the polycrystalline CVD synthetic diamond dresser can be consistently oriented such that the leading edge of the working surface of the polycrystalline CVD synthetic diamond dresser is formed of larger grains than the trailing edge of the working surface of the polycrystalline CVD synthetic diamond dresser. The visually marker may be provided on a surface of the dresser. However, such a mark potentially be removed in use. Accordingly, one alternative for the visual marker is to provide a dresser part in which the working surface haves an asymmetric shape. This asymmetric shape can then be used to correctly orientate the working surface such that the leading edge corresponds to the growth face of the original polycrystalline CVD diamond wafer from which the dresser part was cut. For example, the working surface of the polycrystalline CVD synthetic diamond dresser may be trapezoidal in shape. A particularly preferred configuration is to provide a trapezoidal working surface with the leading edge having larger grains being the longest parallel edge of the trapezoidal working surface.

The aforementioned polycrystalline CVD synthetic diamond dresser can be fabricated by a method comprising:

fabricating a free-standing wafer of polycrystalline CVD synthetic diamond material having a nucleation face and a growth face, the growth face comprising larger grains than the nucleation face;

cutting the free-standing wafer of polycrystalline CVD synthetic diamond material to form a polycrystalline CVD synthetic diamond dresser;

and marking the polycrystalline CVD synthetic diamond dresser to indicate which side of the polycrystalline CVD synthetic diamond dresser corresponds to the growth face comprising larger grains whereby in use the polycrystalline CVD synthetic diamond dresser can be consistently oriented such that a leading edge of a working surface of the polycrystalline CVD synthetic diamond dresser is formed of larger grains than a trailing edge of the working surface of the polycrystalline CVD synthetic diamond dresser.

Figure 6:
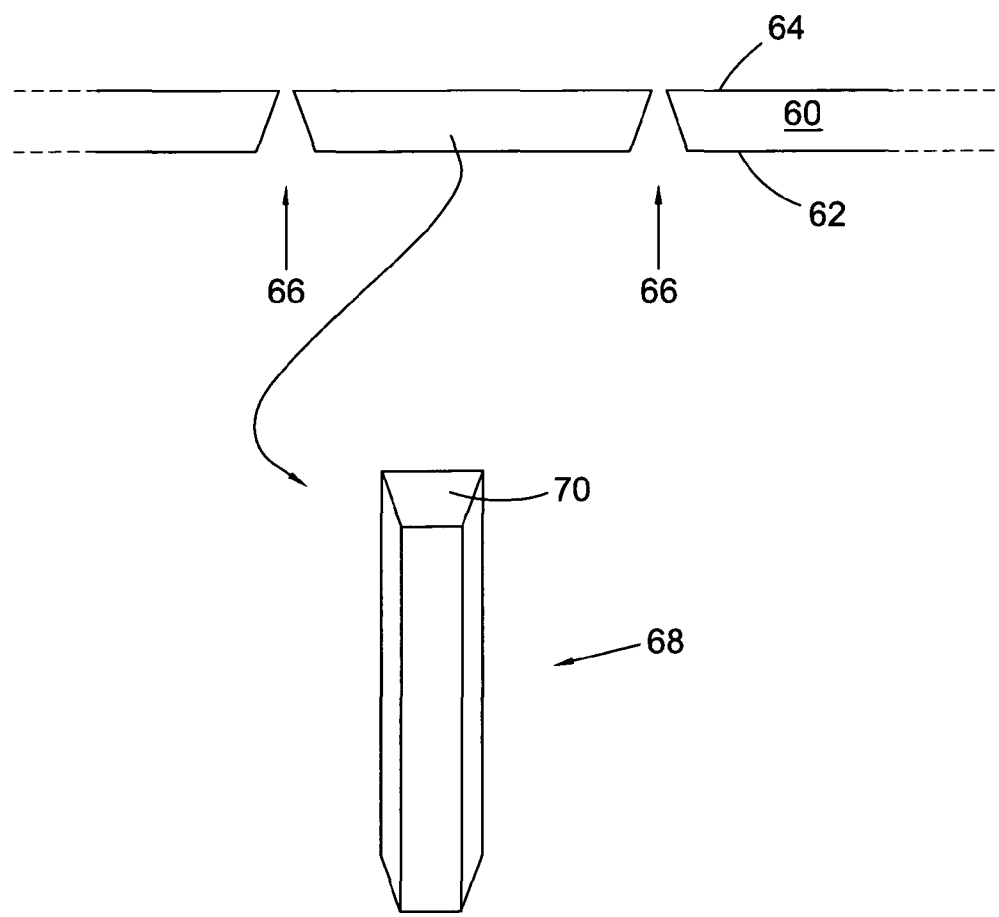
FIG. 6 illustrates the steps involved in fabricating a polycrystalline CVD synthetic diamond dresser which can readily be oriented in the preferred orientation in use.

The marking may be integrally performed during the cutting step, the free-standing wafer of polycrystalline CVD synthetic diamond material being cut such that the working surface of the polycrystalline CVD synthetic diamond dresser has an asymmetric shape as previously described. In this regard, it has been found that cutting of a dresser part from a disk of polycrystalline CVD synthetic diamond material using a technique such as laser cutting results in the formation of a kerf angle. This is due to the fact that such a cut is wider at the front face when compared to the rear face of the disk being cut as illustrated in FIG. 6. In FIG. 6 a polycrystalline CVD synthetic diamond disk 60 has a nucleation face 62 and a growth face 64. Lasers cutting 66 through the nucleation face creates a trapezoidal dresser part 68 due to laser kerf loss. The working surface 70 of the dresser part thus has a trapezoidal shape. If the dresser part is cut using a cutting direction from a nucleation face to a growth face of a polycrystalline CVD synthetic diamond disk then the dresser part will have a working surface having a trapezoidal shape with the nucleation edge being shorter than the growth surface edge. As such, the dresser part can readily be oriented such that the lead edge in use is the longest of the parallel edges of the trapezoidal working surface corresponding to the growth face of the polycrystalline CVD synthetic diamond disk 60. Accordingly, advantageously the free-standing wafer of polycrystalline CVD synthetic diamond material is cut in a direction from the nucleation face to the growth face to form the polycrystalline CVD synthetic diamond dresser. In such an arrangement, if the cutting is performed at an energy and cutting rate suitable to generate a visually observable kerf loss angle then the kerf loss angle results in a trapezoidal working surface without further processing required. For example, the kerf loss angle may lie in a range 1° to 10°, 1° to 8°, 1° to 6°, 2° to 6°, or 2° to 4°. The kerf loss angle should be sufficiently large such that it can be visually observed. However, the kerf loss should not be so large that excessive material is lost during the cutting process.

While this invention has been particularly shown and described with reference to preferred embodiments, it will be understood to those skilled in the art that various changes in form and detail may be made without departing from the scope of the invention as defined by the appendant claims.

The invention claimed is:

1. A method of dressing a wheel using a polycrystalline CVD synthetic diamond dresser, the method comprising:
    rotating the wheel; and
    contacting a working surface of the wheel with a working surface of the polycrystalline CVD synthetic diamond dresser,
    wherein the polycrystalline CVD synthetic diamond dresser is oriented such that a leading edge of the working surface of the polycrystalline CVD synthetic diamond dresser is formed of larger grains than a trailing edge of the working surface of the polycrystalline CVD synthetic diamond dresser.

2. A method of dressing a wheel according to claim 1, wherein the polycrystalline CVD synthetic diamond dresser is provided with a visual marker to indicate correct orientation whereby in use the polycrystalline CVD synthetic diamond dresser can be consistently oriented such that the leading edge of the working surface of the polycrystalline CVD synthetic diamond dresser is formed of larger grains than the trailing edge of the working surface of the polycrystalline CVD synthetic diamond dresser.

3. A method of dressing a wheel according to claim 2, wherein the visual marker is provided by the working surface having an asymmetric shape.

4. A method of dressing a wheel according to claim 3, wherein the working surface of the polycrystalline CVD synthetic diamond dresser is trapezoidal in shape.

5. A method of dressing a wheel according to claim 4, wherein the polycrystalline CVD synthetic diamond dresser is oriented such that the leading edge having larger grains is a longest parallel edge of the trapezoidal working surface.

6. A method of fabricating a polycrystalline CVD synthetic diamond dresser, the method comprising:
    fabricating a free-standing wafer of polycrystalline CVD synthetic diamond material having a nucleation face and a growth face, the growth face comprising larger grains than the nucleation face;
    cutting the free-standing wafer of polycrystalline CVD synthetic diamond material to form a polycrystalline CVD synthetic diamond dresser;
    and marking the polycrystalline CVD synthetic diamond dresser to indicate which side of the polycrystalline CVD synthetic diamond dresser corresponds to the growth face comprising larger grains whereby in use the polycrystalline CVD synthetic diamond dresser can be consistently oriented such that a leading edge of a working surface of the polycrystalline CVD synthetic diamond dresser is formed of larger grains than a trailing edge of the working surface of the polycrystalline CVD synthetic diamond dresser.

7. A method according to claim 6, wherein the marking is integrally performed during the cutting step, the free-standing wafer of polycrystalline CVD synthetic diamond material being cut such that the working surface of the polycrystalline CVD synthetic diamond dresser has an asymmetric shape.

8. A method according to claim 7, wherein the free-standing wafer of polycrystalline CVD synthetic diamond material is cut such that the working surface of the polycrystalline CVD synthetic diamond dresser has a trapezoidal shape.

9. A method according to claim 8, wherein a longest parallel edge of the trapezoidal working surface corresponds to the growth face and a shortest parallel edge of the trapezoidal working surface corresponds to the nucleation face.

10. A method according to claim 9, wherein the free-standing wafer of polycrystalline CVD synthetic diamond material is cut in a direction from the nucleation face to the growth face to form the polycrystalline CVD synthetic diamond dresser.

11. A method according to claim 8, wherein the cutting is performed at an energy and cutting rate suitable to generate a visually observable kerf loss angle.

12. A method according to claim 11, wherein the kerf loss angle lies in a range 1° to 10°, 1° to 8°, 1° to 6°, 2° to 6°, or 2° to 4°.

* * * * *